United States Patent
Seymour et al.

(10) Patent No.: US 7,211,179 B2
(45) Date of Patent: May 1, 2007

(54) DUAL ANODE AC SUPPLY FOR CONTINUOUS DEPOSITION OF A CATHODE MATERIAL

(75) Inventors: Eric Seymour, Fort Collins, CO (US); Richard A. Scholl, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 108 days.

(21) Appl. No.: 11/016,249

(22) Filed: Dec. 17, 2004

(65) Prior Publication Data

US 2006/0131170 A1   Jun. 22, 2006

(51) Int. Cl.
 *C23C 14/35* (2006.01)
(52) U.S. Cl. .......................... 204/298.08; 204/298.14; 204/298.06
(58) Field of Classification Search ........... 204/298.08, 204/298.06, 298.14
See application file for complete search history.

(56) References Cited

U.S. PATENT DOCUMENTS

| | | | | |
|---|---|---|---|---|
| 5,415,757 A | * | 5/1995 | Szcyrbowski et al. . | 204/298.08 |
| 5,897,753 A | * | 4/1999 | Schatz et al. .......... | 204/192.12 |
| 6,183,605 B1 | * | 2/2001 | Schatz et al. .......... | 204/192.12 |

* cited by examiner

Primary Examiner—Rodney G. McDonald
(74) Attorney, Agent, or Firm—Cooley Godward Kronish LLP

(57) ABSTRACT

There is provided by this invention an apparatus for sputter deposition of an insulating material in a continuous mode of operation that utilizes at least two sputtering anodes and a cathode connected to a center tapped conductor to maintain the target cathode at a negative potential with respect to the plasma wherein an ac power supply drives each anode alternately to an ion collecting state to attract ions in the half cycle that a sputtering anode is at a negative potential relative to the plasma, and an electron collecting state to attract electrons in the half cycle that a sputtering anode is at a small potential relative to the plasma or is near the plasma potential. In an alternate embodiment the center tapped conductor is replaced with a pair of series connected diodes having the cathode of a first diode connected to a first sputtering anode, a cathode of a second diode connected to a second sputtering anode and the junction of the anodes of the first and second diodes connected to the target cathode to maintain the target cathode at a negative potential with respect to said plasma wherein the ac power supply drives each sputtering anode alternately to an ion collecting state to attract ions in the half cycle that an anode is at a negative potential relative to the plasma, and an electron collecting state to attract electrons in the half cycle that an anode is at a potential relative to the plasma small compared to the power supply voltage and providing for plasma current flow during the period either sputtering anode is in an ion collecting state.

10 Claims, 3 Drawing Sheets

DUAL ANODE AC SUPPLY FOR CONTINUOUS DEPOSITION OF A CATHODE MATERIAL

BACKGROUND OF THE INVENTION

1. Field of the Invention

This invention relates generally to reactive plasma sputter deposition processes for forming and depositing insulating films on substrates and more particularly to reactive plasma sputtering processes that utilize an ac power supply connected to at least two anodes driven alternatively negative and positive in the sputtering process.

2. Brief Description of the Prior Art

In traditional dc sputtering processes the target or cathode must be conducting because ions arriving at the target must be able to accept electrons from the target to become neutral gas atoms again. If the target is insulating, its surface would become quickly charged by the arriving ions, which would create a retarding potential which would stop the sputtering process. On the other hand, one can deposit films of insulating material from a metallic target by forming the insulator chemically through reaction with a reactive background gas. This is called reactive sputtering. There is increasing commercial interest in processes involving deposition of such insulating films. New applications of this process include the areas of deposition of wear resistant coatings; insulating films for microcircuits or electronic devices such as capacitors; sophisticated architectural glass coatings; coatings on polyester film for architectural glass laminates or oxygen barriers for food packaging; heat reflecting coatings for high efficiency lamps or induction furnace heat shields; deposition of barrier and functional layers for flat panel displays, including the ITO glass used in LCD displays; and a myriad of other similar functional applications. Added to this are the many reactive PVD processes used to create decorative effects on a wide variety of plastic, natural and artificial fiber, and metal substrates.

A problem occurs at the anode, however, if the reaction product is an electrical insulator. Since the insulating film coats every surface in the chamber, it will surely also coat the anode, whether the anode is a separate element or the chamber walls. The purpose of the anode, of course, is to collect electrons from the plasma to maintain plasma neutrality as ions leave to bombard the target; these electrons form the return current for the power supply. As the anode is coated over with the insulating film, the conduction path for the electrons is also coated over, and the do sputtering process cannot be sustained. This is called the "disappearing anode" problem. In the past, with single target sputtering, a reactive process was run until this effect began to create serious problems, whereupon the system was opened to mechanically scrub off the offending insulating layer from the anode to create a new metallic surface, or to replace the anode with a new, uncoated one. Another drawback related to the coating of the anode with an insulator is that this insulator will generally charge up as the electrons attempt to collect there. This charge can cause an electric field in the insulating film on the anode, which may exceed the dielectric strength of the film material. When this occurs an arc may be formed, and the energy in this arc may cause portions of the film to be ejected from the anode, creating particles, which can become included in the film growing on the substrate. This causes defects which may be unacceptable in the final product. Even if arcing does not occur at the anode, the charging described above can cause electric fields which affect the return of electrons to the anode. This in turn may create a nonuniform plasma density in large systems, causing nonuniform deposition rates along an extended target surface. Any resulting nonuniform film thickness can produce unacceptable coated product from the system (i.e., production yield loss) even before arcing presents a system problem. This charging is not limited to the anode; insulating islands can build up on the target (cathode) surface as well, due to chemical reaction or backscattering redeposition of insulating material outside the sputtering zone of the target. These insulating islands can charge up due to the ion bombardment and create arcing and nonuniform electric fields.

This problem was addressed in U.S. Pat. No. 6,183,605 entitled "AC Powered System for Continuous Deposition of a Cathode Material" issued on Feb. 6, 2001, assigned to the assignee of the instant application and incorporated herein by reference. In this patent, two anodes were provided, each connected to one side of a center tapped ac power source. The center point, or "tap," of the power supply is connected to a single magnetron sputtering source of the ordinary variety. Once a plasma has been established, when one anode starts positive with respect to the other, the first anode will collect electrons. If it is of sufficient area and without a magnetic field, it will assume a potential close to potential of the plasma. This will cause electron current in one half of the secondary of the transformer, flowing from the first anode to the target. These electrons combine with ions arriving at the target from the plasma to complete the electrical circuit. Meanwhile, the target will be negative with respect to the plasma by half the secondary voltage. This negative potential attracts ions from the plasma to sputter the target. The second anode is driven still further negative with respect to the plasma by the action of the transformer, to twice the target potential. This electrode thus also attracts ions from the plasma, causing sputtering of its surface, which can remove any build-up of insulating materials formed there previously.

Similarly, on the other half-cycle of the power supply, when the voltage is such that the second anode starts positive with respect to the first anode, the second anode will collect electrons, assuming a potential close to the plasma potential. This will cause electron current in the other half of the secondary of the transformer. Again, the target will be negative with respect to the plasma by half the secondary voltage, and will continue to be sputtered by ions from the plasma. On this part of the cycle, however, the first anode is driven negative, causing sputtering of its surface, removing any build-up of insulating materials which might have formed there when it was biased positively. Thus each of the anode elements act alternatively as true anodes (electron collectors) and as sputtered cathodes (ion collectors), depending upon the polarity of the ac power supply.

It is an object of this invention to improve upon the reactive sputtering process of the '605 patent by providing a sputtering system that replaces the transformer with a single center tapped inductor that greatly simplifies the design.

It a further object of this invention to improve upon the reactive sputtering process of the '605 patent by providing a sputtering system that does not rely on a magnetic at all. Such a system will have the advantages of requiring less space and being less costly.

SUMMARY OF THE INVENTION

There is provided by this invention an improved apparatus for reactive sputtering that utilizes a single center tapped inductor driven by an ac power supply that removes any build-up of insulating materials on multiple anodes wherein each of the anode elements act alternatively as true anodes (electron collectors) and as sputtered cathodes (ion collectors), depending upon the polarity of the ac power supply. In another embodiment of this invention the inductor is replaced by diodes that provide for plasma current flow during the period either anode is in an ion collecting state.

BRIEF DESCRIPTION OF THE PREFERRED EMBODIMENT

Figure 1:
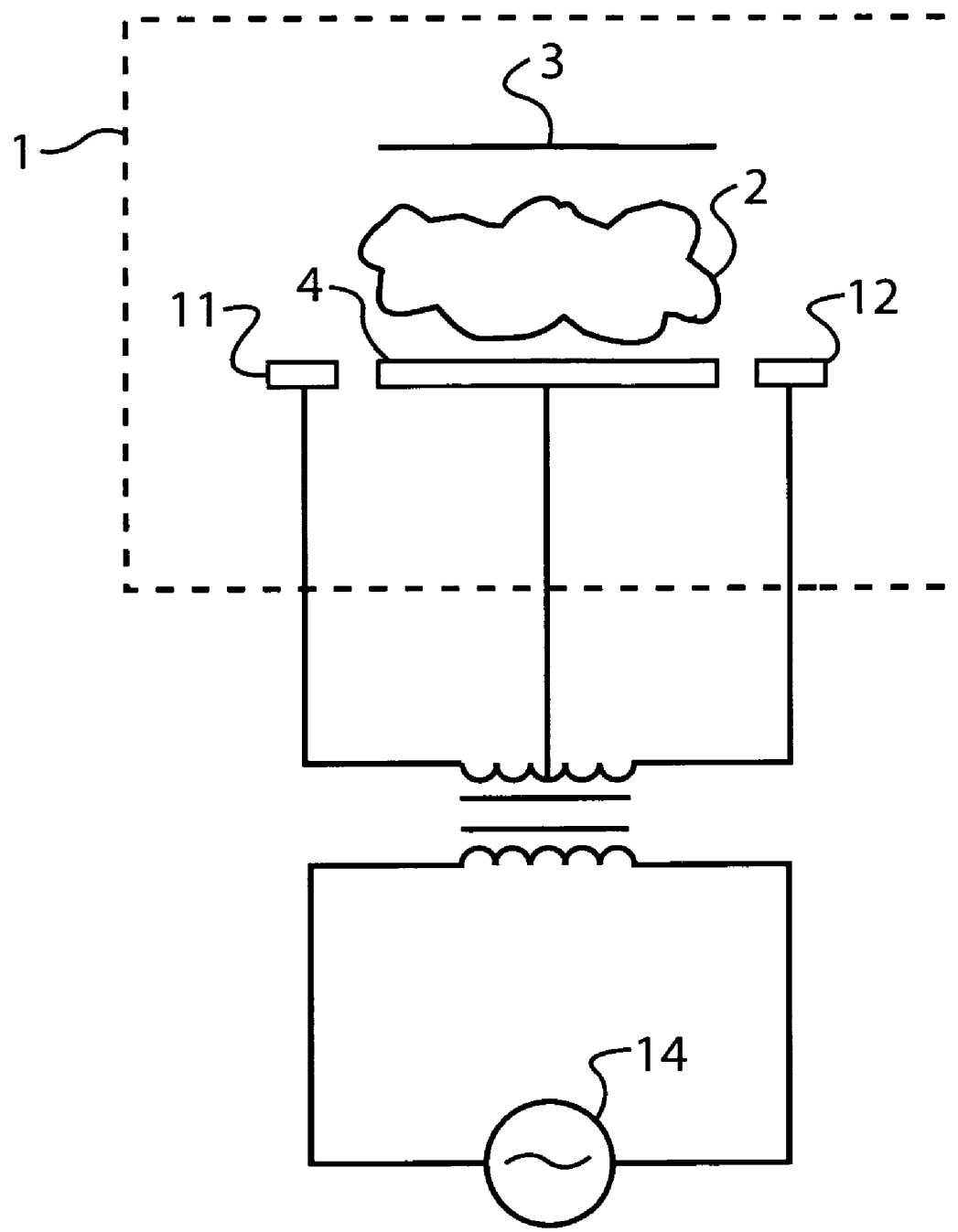
FIG. 1 illustrates a prior art dual target sputtering system utilizing an ac supply driving a center tapped transformer.

Referring to FIG. 1 there is shown a dual sputtering system utilizing an ac power supply driving a center tapped transformer as taught by the U.S. Pat. No. 6,183,605 assigned to the assignee of the instant application and incorporated herein by reference. In chamber 1 are disposed substrate 3, target 4, and at least two anodes 11 and 12. Anode drive supply 14 provides an alternating voltage isolated by anode transformer 13 to the two anodes such that when anode 11 is driven positive, anode 12 is driven negative and vice versa. The secondary of transformer 13 has a "tap", by which we mean that a connection is made to the secondary winding at a point removed from the ends. The tap may or may not be in the electrical center of the transformer so as to effect an equal division of the voltage. When the voltage cycle of the anode supply 14 is such that anode 11 is positive with respect to anode 12, anode 11 will collect electrons from the plasma (i.e., it can be said to be in an "electron-collecting" state). This will cause electron current in the left half of the secondary of transformer 13, flowing from anode 11 to the target 4. These electrons combine with ions arriving at target 4 from plasma 2 to complete the circuit. Meanwhile, anode 12 is driven negative with respect to the plasma by the action of transformer 13 and anode supply 14, and this negative potential attracts additional ions from the plasma (i.e., the anode is in an "ion-collecting" state). These ions cause sputtering of the surface of anode 12. This sputtering of anode 12 removes any buildup of insulating materials which might have formed there on the previous half cycle of the ac power supply 14 when anode 12 was positive and therefore near to the plasma potential.

Similarly, when the voltage cycle of the anode supply 14 is such that anode 12 is positive with respect to anode 11, anode 12 will collect electrons from the plasma. This will cause electron current in the right half of the secondary of transformer 13, flowing from anode 12 to the target 4. These electrons combine with ions arriving at target 4 from plasma 2 to complete the circuit. Meanwhile, anode 11 is driven negative with respect to the plasma by the action of transformer 13 and anode supply 14, and this negative potential attracts ions from the plasma which causes sputtering of the surface of anode 11. This sputtering of anode 11 removes any buildup of insulating materials which might have formed there on the previous half cycle of the ac power supply 14 when anode 11 was positive and therefore near to the plasma potential. Thus each of the anode elements 11 and 12 act alternatively as true anodes (electron collectors) and as sputtered cathodes (ion collectors) depending upon the instantaneous polarity of the ac power supply 14.

Figure 2:
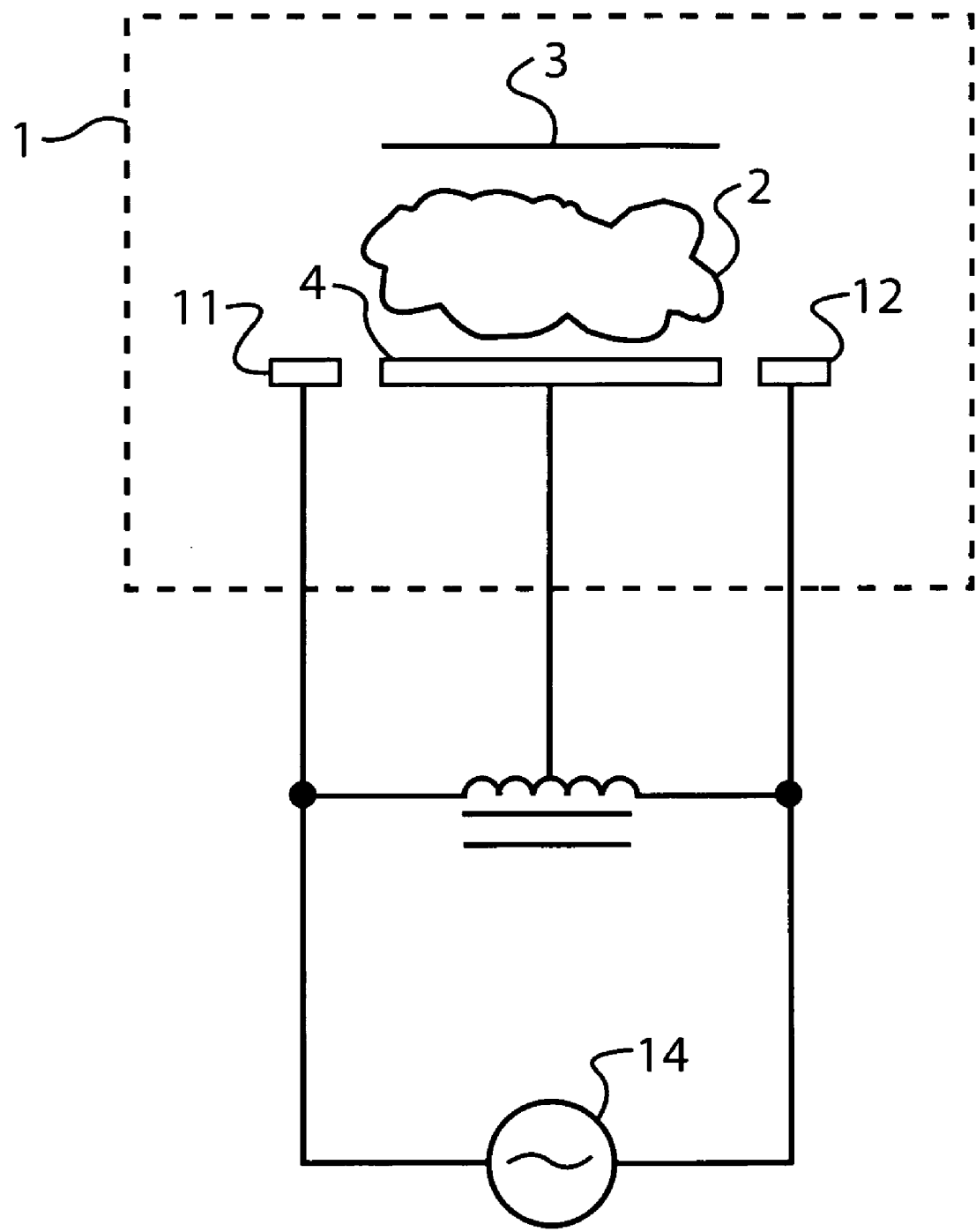
FIG. 2 illustrates a dual target sputtering system utilizing an ac supply driving a center tapped inductor incorporating the principles of this invention.

Referring to FIG. 2 there is illustrated a dual sputtering system utilizing an ac power supply driving a center tapped inductor instead of a transformer. The operation and performance of the system is the same as that described above for the transformer application. However, the single tapped inductor is space saving and less costly than the transformer application.

Figure 3:
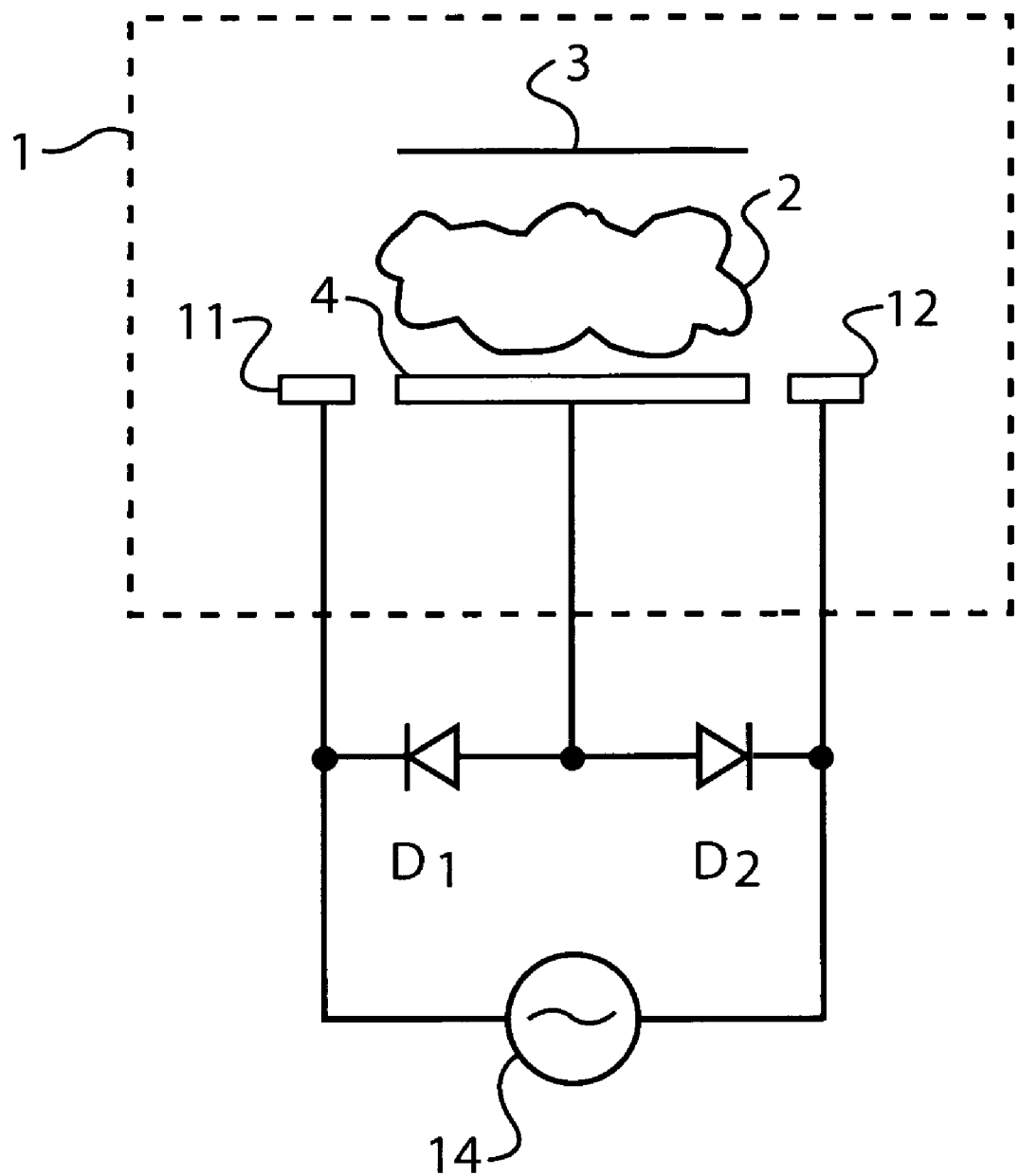
FIG. 3 illustrates a dual target sputtering system utilizing an ac supply driving dual diodes incorporating the principles of this invention.

FIG. 3 illustrates a dual sputtering system utilizing an ac power supply that replaces the transformer and inductor with a pair of diodes having the cathode 4 connected to their junction. This circuit design operates very similar to the circuit design of FIG. 1. When the voltage cycle of the anode supply 14 is such that anode 11 is positive with respect to anode 12, anode 11 will collect electrons from the plasma (i.e., anode 11 can be said to be in an "electron-collecting" state). This will be balanced by electron current flowing to the target 4 through diode D2 from the power supply 14. Meanwhile, anode 12 is driven negative with respect to the plasma by the action of the power supply 14, and this negative potential attracts additional ions from the plasma (i.e., the anode 12 is in an "ion-collecting" state).

Similarly, when the voltage cycle of the anode supply 14 is such that anode 12 is positive with respect to anode 11, anode 12 will collect electrons from the plasma. This will be balanced by electron current flowing to the target 4 through diode D1 from the power supply 14. Meanwhile, anode 11 is driven negative with respect to the plasma by the action of diode D1 and anode supply 14, and this negative potential attracts ions from the plasma which causes sputtering of the surface of anode 11. This sputtering of anode 11 removes any buildup of insulating materials which might have formed there on the previous half cycle of the ac power supply 14 when anode 11 was positive and therefore near to the plasma potential. Again each of the anode elements 11 and 12 act alternatively as true anodes (electron collectors) and as sputtered cathodes (ion collectors) depending upon the instantaneous polarity of the ac power supply 14.

The invention has been described in detail with particular reference to a preferred embodiment. It will be understood that variations and modifications in addition to those described can be effected within the spirit and scope of the invention. It will be further understood that changes, alterations, modifications, or substitutions can be made in the structure of the apparatus in accordance with the invention without departing from the spirit and scope of the invention.

We claim:

1. Apparatus for sputter deposition of a cathode material comprising:
    a) a plasma chamber in which a plasma is created containing ions and electrons;
    b) at least two sputtering anodes disposed in the plasma chamber;
    c) a target cathode disposed in the plasma chamber in close proximity to the plasma wherein the target cathode is comprised of atoms that can be sputtered therefrom in response to bombardment by ions from the plasma to comprise a film on the surface of a substrate contained in the plasma chamber; and
    d) an ac power supply connected in parallel with a center tapped inductor having one terminal connected to a first sputtering anode and a first line of the ac power supply, a second terminal connected to a second sputtering anode and a second line of the ac power supply and the center tap of the inductor connected to the target cathode to maintain the target cathode at a negative potential with respect to said plasma wherein the ac power supply drives each anode alternately to an ion collecting state to attract ions in the half cycle that a sputtering anode is at a negative potential relative to the plasma, and an electron collecting state to attract electrons in the half cycle that a sputtering anode is at a small potential relative to the plasma or is near the plasma potential.

2. Apparatus for sputter deposition of a cathode material as recited in claim 1 wherein the ac power supply is at a frequency such that the target cathode surface assumes a self bias potential which is negative relative to the plasma.

3. Apparatus for spuffer deposition of a cathode material as recited in claim 1 wherein ac power supply has a cycle where at least one of the sputtering anodes is always in an ion collecting state for less than the time required to extinguish the plasma.

4. Apparatus for sputter deposition of a cathode material as recited in claim 1 wherein the plasma chamber contains a reactive gas.

5. Apparatus for sputter deposition of a cathode material as recited in claim 4 wherein atoms sputtered from the target cathode in response to bombardment by the ions react with the reactive gas to form and deposit the film.

6. Apparatus for sputter deposition of a cathode material comprising:
   a) a plasma chamber in which a plasma is created containing ions and electrons;
   b) at least two sputtering anodes disposed in the plasma chamber;
   c) a target cathode disposed in the plasma chamber in close proximity to the plasma wherein the cathode is comprised of atoms that can be sputtered therefrom in response to bombardment by ions from the plasma to deposit a film on the surface of a substrate contained in the plasma chamber; and d) an ac power supply connected in parallel with a pair of series connected diodes having the cathode of a first diode connected to a first sputtering anode, a cathode of a second diode connected to a second sputtering anode and the junction of the anodes of the first and second diodes connected to the target cathode to maintain the target cathode at a negative potential with respect to said plasma wherein the ac power supply drives each sputtering anode alternately to an ion collecting state to attract ions in the half cycle that an anode is at a negative potential relative to the plasma, and an electron collecting state to attract electrons in the half cycle that an anode is at a potential relative to the plasma small compared to the power supply voltage and providing for plasma current flow during the period either sputtering anode is in an ion collecting state.

7. Apparatus for sputter deposition of a cathode material as recited in claim 6 wherein the ac power supply is at a frequency such that the target cathode surface assumes a self bias potential which is negative relate to the plasma.

8. Apparatus for sputter deposition of a cathode material as recited in claim 6 wherein ac power supply has a cycle where at least one of the sputtering anodes is always in an ion collecting state for less than the time required to extinguish the plasma.

9. Apparatus for sputter deposition of a cathode material as recited in claim 6 wherein the plasma chamber contains a reactive gas.

10. Apparatus for sputter deposition of a cathode material as recited in claim 9 wherein atoms sputtered from the target cathode in response to bombardment by the ions react with the reactive gas to form and deposit the film.

* * * * *